United States Patent
Khazaka et al.

(10) Patent No.: US 11,946,157 B2
(45) Date of Patent: Apr. 2, 2024

(54) METHOD FOR DEPOSITING BORON CONTAINING SILICON GERMANIUM LAYERS

(71) Applicant: ASM IP Holding B.V., Almere (NL)

(72) Inventors: Rami Khazaka, Leuven (BE); Qi Xie, Wilsele (BE)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 17/743,039

(22) Filed: May 12, 2022

(65) Prior Publication Data
US 2022/0364262 A1 Nov. 17, 2022

Related U.S. Application Data

(60) Provisional application No. 63/256,759, filed on Oct. 18, 2021, provisional application No. 63/243,809, filed on Sep. 14, 2021, provisional application No. 63/189,348, filed on May 17, 2021.

(51) Int. Cl.
| | |
|---|---|
| *C30B 25/10* | (2006.01) |
| *C30B 29/06* | (2006.01) |
| *C30B 29/08* | (2006.01) |
| *C30B 33/12* | (2006.01) |

(52) U.S. Cl.
CPC ............. *C30B 25/10* (2013.01); *C30B 29/06* (2013.01); *C30B 29/08* (2013.01); *C30B 33/12* (2013.01)

(58) Field of Classification Search
CPC ......... C30B 25/10; C30B 29/06; C30B 33/12; C30B 29/08
See application file for complete search history.

(56) References Cited

U.S. PATENT DOCUMENTS

| | | | |
|---|---|---|---|
| 9,892,913 B2 | 2/2018 | Margetis | |
| 11,018,003 B2* | 5/2021 | Huang | H01L 21/02576 |
| 2018/0096844 A1* | 4/2018 | Dutartre | H01L 21/02381 |
| 2018/0174912 A1* | 6/2018 | Lee | H01L 21/8221 |
| 2020/0168735 A1* | 5/2020 | Yu | H01L 29/0847 |
| 2020/0266208 A1* | 8/2020 | Kim | H10B 41/27 |

FOREIGN PATENT DOCUMENTS

GB 2368726 B 10/2002

OTHER PUBLICATIONS

Aubin, J., et al. "Very low temperature (450° C.) selective epitaxial growth of heavily in situ boron-doped SiGe layers." Semiconductor Science and Technology 30 (2015) 115006 (10pp).

* cited by examiner

*Primary Examiner* — Robert M Kunemund
(74) *Attorney, Agent, or Firm* — Snell & Wilmer L.L.P.

(57) ABSTRACT

Methods and devices for epitaxially growing boron doped silicon germanium layers. The layers may be used, for example, as a p-type source and/or drain regions in field effect transistors.

18 Claims, 6 Drawing Sheets

METHOD FOR DEPOSITING BORON CONTAINING SILICON GERMANIUM LAYERS

CROSS-REFERENCE TO RELATED APPLICATIONS

This application claims priority to U.S. Provisional Patent Application Ser. No. 63/189,348 filed May 17, 2021 titled METHOD FOR DEPOSITING BORON CONTAINING SILICON GERMANIUM LAYERS; U.S. Provisional Patent Application Ser. No. 63/243,809 filed Sep. 14, 2021 titled METHOD FOR DEPOSITING BORON CONTAINING SILICON GERMANIUM LAYERS; and U.S. Provisional Patent Application Ser. No. 63/256,759 filed Oct. 18, 2021 titled METHOD FOR DEPOSITING BORON CONTAINING SILICON GERMANIUM LAYERS, the disclosures of which is hereby incorporated by reference in their entirety.

FIELD OF INVENTION

The present disclosure generally relates to methods and systems suitable for forming electronic devices. More particularly, the disclosure relates to methods and systems that can be used for depositing material, for example, for selectively depositing material, such as boron doped silicon germanium, on a surface of a substrate.

BACKGROUND OF THE DISCLOSURE

The scaling of semiconductor devices, such as, for example, complementary metal-oxide-semiconductor (CMOS) devices, has led to significant improvements in speed and density of integrated circuits. However, conventional device scaling techniques face significant challenges for future technology nodes.

One particular challenge relates to the manufacture of defect-free active regions of a semiconductor device structure. Examples of such active regions are source, drain, and channel regions in field effect transistors, e.g., FinFETs, gate all around transistors, and the like. Furthermore, in many applications, it may be desirable to selectively deposit semiconductor material (e.g., Group IV semiconductor material) that incorporates a dopant. However, such techniques may not be well developed. Accordingly, improved methods and systems for depositing doped semiconductor material are desired.

In addition, there is a particular need for epitaxially depositing semiconductor material at ever-lower temperatures because the thermal budget that many advanced electronic devices can withstand is limited.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

Various embodiments of the present disclosure relate to deposition methods, e.g., selective or non-selective deposition methods, to structures and devices formed using such methods, and to apparatus for performing the methods and/or for forming the structure and/or devices. While the ways in which various embodiments of the present disclosure address drawbacks of prior methods and systems are discussed in more detail below, in general, various embodiments of the disclosure provide improved methods of selectively depositing doped semiconductor layers. The doped semiconductor layers may be suitable as source, drain, and/or channel regions in field effect transistors such as FinFETs and gate all around metal oxide semiconductor field effect transistors.

In particular, described herein is a method for epitaxially growing a boron doped silicon germanium layer. The method comprises providing a substrate comprising a monocrystalline surface in a reaction chamber. The method comprises exposing the substrate to a silicon precursor, a germanium precursor, and a boron precursor into the reaction chamber. The silicon precursor comprises a halosilane. While exposing the substrate to the silicon precursor, the germanium precursor, and the boron precursor, the substrate is maintained at a temperature of at most 450° C. Thus, a boron doped silicon germanium layer is grown on the monocrystalline surface.

In some embodiments, the substrate is maintained at a temperature of at least 300° C. to at most 450° C.

In some embodiments, the silicon precursor comprises a chlorosilane.

In some embodiments, the chlorosilane comprises dichlorosilane.

In some embodiments, the reaction chamber is maintained at a pressure of at least 5 Torr to at most 160 Torr.

In some embodiments, the substrate comprises a first surface and a second surface. The first surface is a monocrystalline surface and the second surface is a dielectric surface. In such embodiments, the boron doped silicon germanium layer is selectively and epitaxially grown on the first surface.

In some embodiments, parasitic boron doped silicon germanium is grown on the second surface and the method further comprising a step of: exposing the substrate to an etch gas, thereby etching the parasitic boron doped silicon germanium grown on the second surface.

In some embodiments, the parasitic boron doped silicon germanium comprises parasitic boron doped silicon germanium nuclei and/or amorphous silicon germanium.

In some embodiments, the method comprises a plurality of deposition-etch cycles. A deposition-etch cycle comprises the steps of introducing the silicon precursor, the germanium precursor, and the boron precursor into the reaction chamber; and, introducing an etch gas into the reaction chamber.

In some embodiments, the etch gas comprises a halogen.

In some embodiments, the etch gas is selected from the list consisting of HCl, $Cl_2$, and HBr.

In some embodiments, the second surface is selected from the list consisting of a silicon oxide surface, a silicon nitride surface, a silicon oxycarbide surface, a silicon oxynitride surface, a hafnium oxide surface, a zirconium oxide surface, and an aluminum oxide surface.

In some embodiments, the monocrystalline surface comprises a monocrystalline silicon surface.

In some embodiments, the monocrystalline surface comprises a monocrystalline silicon germanium surface.

In some embodiments, the germanium precursor comprises a germane.

In some embodiments, the boron precursor comprises a borane.

In some embodiments, the silicon precursor comprises the halosilane and a silane.

In some embodiments, the boron doped silicon germanium layer has a resistivity of at most 0.2 mOhm·cm.

Further described is a system comprising one or more reaction chambers, a gas injection system, and a controller configured for causing the system to perform a method according to the present disclosure.

Further described is a field effect transistor comprising a boron doped silicon germanium layer as at least one of a source or drain region, wherein the boron doped silicon germanium layer is deposited by means of a method according to the present disclosure.

These and other embodiments will become readily apparent to those skilled in the art from the following detailed description of certain embodiments having reference to the attached figures. The invention is not being limited to any particular embodiments disclosed.

BRIEF DESCRIPTION OF THE FIGURES

A more complete understanding of the embodiments of the present disclosure may be derived by referring to the detailed description and claims when considered in connection with the following illustrative figures.

FIG. 4 shows X-Ray Diffraction (XRD) measurements performed a boron-doped silicon germanium layer that was deposited by means of a method as described herein.

Figure 1:
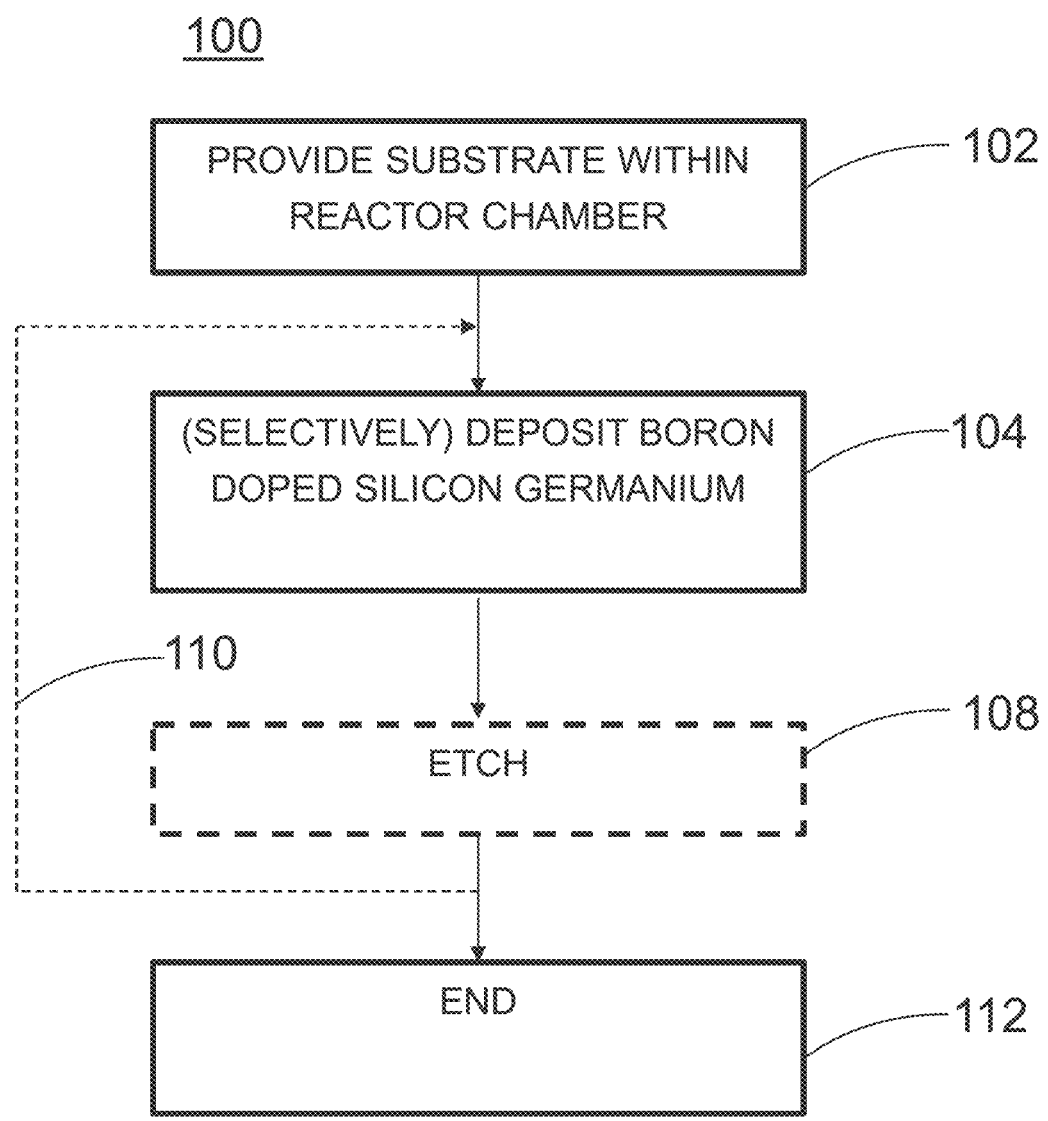
FIG. 1 illustrates a method in accordance with exemplary embodiments of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices, and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

As set forth in more detail below, various embodiments of the disclosure provide methods for depositing boron doped silicon germanium on a surface of a substrate. Exemplary methods can be used to, for example, form source and/or drain regions of semiconductor devices that exhibit relatively high mobility, relatively low resistivity, relatively low contact resistance, and that maintain the structure and composition of the deposited layers. For example, the layers can be used as p-type source and/or drain regions in p-channel MOSFETS. Exemplary MOSFETS in which these layers can be used include FinFETs and GAA (Gate-All-Around) FETS. In addition, the present methods can be used to form low-defect channel regions in n-channel MOSFETS. In addition, the present layers are especially useful for the formation of shallow junctions. In some embodiments, the present methods involve selectively depositing boron doped silicon germanium.

As used herein, the term "gate all around transistor" may refer to devices that include a conductive material wrapped around a semiconductor channel region. As used herein, the term "gate all around transistor" may also refer to a variety of device architectures such as nanosheet devices, forksheet devices, vertical FETs, etc.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, a multi-port injection system, other gas distribution device, or the like, can be used for, e.g., sealing the reaction space, and can include a seal gas, such as a noble gas. In some cases, the term "precursor" can refer to a compound that participates in the chemical reaction that produces another compound, and particularly to a compound that constitutes a film matrix or a main skeleton of a film; the term "reactant" can be used interchangeably with the term precursor.

As used herein, the term "substrate" can refer to any underlying material or materials that can be used to form, or upon which, a device, a circuit, or a film can be formed. As set forth in more detail below, a surface of a substrate can include two or more areas, wherein each of the two or more areas comprise different material.

As used herein, the term "epitaxial layer" can refer to a substantially single crystalline layer upon an underlying substantially single crystalline substrate or layer, the two substantially single crystalline layers having a substantially identical crystal orientation.

As used herein, the term "chemical vapor deposition" can refer to any process wherein a substrate is exposed to one or more volatile precursors, which react and/or decompose on a substrate surface to produce a desired deposition.

As used herein, the term "film" and/or "layer" can refer to any continuous or non-continuous structures and material, such as material deposited by the methods disclosed herein. For example, a film and/or layer can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous. Alternatively, a film or layer may consist entirely of isolated islands.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. It shall be understood that when a composition, method, device, etc. is said to comprise certain features, it means that it includes those features, and that it does not necessarily excludes the presence of other features, as long as they do not render the claim unworkable. This notwithstanding, the wording "comprises" includes the meaning of "consists of", i.e., the case when the composition, method, device, etc. in question only includes the features, components, and/or steps that are listed, and does not contain any other features, components, steps, etc.

In this disclosure, any defined meanings do not necessarily exclude ordinary and customary meanings in some embodiments.

The term "carrier gas" as used herein may refer to a gas that is provided to a reaction chamber together with one or more precursors. For example, a carrier gas may be provided to the reaction chamber together with one or more of the precursors used herein. Exemplary carrier gasses include $N_2$, and noble gasses such as He, Ne, Kr, Ar, and Xe.

As opposed to a carrier gas, a purge gas may be provided to a reaction chamber separately, i.e., not together with one or more precursors. This notwithstanding, gasses which are commonly used as carrier gas may also be used as a purge gas, even within the same process. For example, in a cyclic deposition-etch process, $N_2$ used as a carrier gas may be provided together with one or more precursors during deposition pulses, and $N_2$ used as a purge gas may be used to separate deposition and etch pulses. Of course, $N_2$ may be replaced by another suitable inert gas such as a noble gas such as He, Ne, Kr, Ar, and Xe. Hence, it is the manner of how a gas is provided to the reaction chamber that determines whether it serves as a purge gas or a carrier gas in a specific context. Thus, as used herein, the term "purge" may refer to a procedure in which an inert or substantially inert gas is provided to a reaction chamber in between two pulses of gasses that react with each other. For example, a purge, e.g., using nitrogen gas, may be provided between a precursor pulse and an etchant pulse, thus avoiding or at least minimizing gas phase reactions between the precursor and the etchant. It shall be understood that a purge can be affected either in time or in space, or both. For example, in the case of temporal purges, a purge step can be used, e.g., in the temporal sequence of providing a first precursor to a reaction chamber, providing a purge gas to the reaction chamber, and providing an etchant to the reaction chamber, wherein the substrate on which a layer is deposited does not move. For example, in the case of spatial purges, a purge step can take the following form: moving a substrate from a first location to which a first precursor is continually supplied, through a purge gas curtain, to a second location to which a second precursor is continually supplied.

Note that the terms "etch pulse" and "etch cycle" can signify an etch step, and can be used interchangeably. Similarly, the terms "deposition pulse" and "deposition cycle" can signify a deposition step, and can be used interchangeably.

As set forth in more detail below, various steps of exemplary methods described herein can be performed in the same reaction chamber or in different reaction chambers of, for example, the same cluster tool.

Thus, described herein is a method for epitaxially growing a boron doped silicon germanium layer. The method comprises providing a substrate that is positioned in a reaction chamber, exposing the substrate to a silicon precursor, a germanium precursor, and a boron precursor, and maintaining the substrate at a temperature of at most 450° C. while the precursors are provided to the reaction chamber. The silicon precursor comprises a halosilane. In some embodiments, the silicon precursor consists of, or essentially consists of, a halosilane. Alternatively, the silicon precursor can, in some embodiments, comprise a mixture of a halosilane with another silicon-containing compound. In exemplary embodiments, the silicon precursor comprises a halosilane and a silane, for example dichlorosilane and silane. The temperature of the substrate can be measured, for example, by means of a thermocouple positioned in a susceptor on which the substrate is positioned in the reaction chamber. Additionally or alternatively, the temperature of the substrate can be measured, for example, by means of a pyrometer positioned in the reaction chamber. The substrate comprises a monocrystalline surface. In other words, the substrate comprises a monocrystalline material that is exposed at a surface of the substrate. Advantageously, the substrate comprises a monocrystalline silicon surface. Additionally or alternatively, the substrate may comprise a monocrystalline silicon germanium surface. Additionally or alternatively, the substrate may comprise a boron doped silicon germanium surface. Thus, when the substrate is exposed to the precursors, boron-doped silicon germanium is epitaxially grown on the monocrystalline surface.

Such layers can advantageously be used for epitaxially growing boron doped silicon germanium layers having a very low resistivity. Thus, also described herein is a method for epitaxially growing a boron doped silicon germanium layer. The method comprises providing a substrate that is positioned in a reaction chamber, exposing the substrate to a silicon precursor, a germanium precursor, and a boron precursor. When the substrate is exposed to the precursors, boron-doped silicon germanium having a resistivity below 0.2 mOhm·cm is epitaxially grown on the monocrystalline surface.

It was surprisingly found that when a boron precursor such as a borane, e.g. $B_2H_2$, is used in conjunction with a halosilane silicon precursor such as dichlorosilane, a fast growth rate and low resistivity can be obtained, even at low temperatures.

In some embodiments, no gallium precursor is used, e.g. no gallium precursor is provided to the reaction chamber while epitaxially growing the boron doped silicon germanium layers. Avoiding the use of a gallium precursor can be advantageous since a gallium precursor can react with a halosilane, thereby reducing growth rate or even substantially inhibiting growth.

In some embodiments, the silicon precursor, the germanium precursor, and the boron precursor are simultaneously introduced into the reaction chamber.

In some embodiments, the boron precursor, the silicon precursor, and the germanium precursor are continually provided to the reaction chamber. In some embodiments, one or more precursors are provided continually to the reaction chamber, and the remaining precursors are provided to the reaction chamber in pulses.

As mentioned before, the silicon precursor comprises a halosilane. Suitable halosilanes include chlorosilanes such as tetrachlorosilane, trichlorosilane, dichlorosilane, and monochlorosilane. In some embodiments, the chlorosilane comprises dichlorosilane. Additionally or alternatively, the halosilane can comprise a borosilane such as tetraborosilane, triborosilane, diborosilane, or monoborosilane. Additionally or alternatively, the halosilane can comprise a iodosilane such as tetraiodosilane, triiodosilane, diiodosilane, or monoiodosilane.

In some embodiments, the silicon precursor comprises the halosilane and a silane. In other words, and in some embodiments, the silicon precursor comprises the halosilane and a silicon hydride. Suitable silanes include monosilane, disilane, and trisilane.

In some embodiments, the germanium precursor comprises a germane. Suitable germanes include $GeH_4$, and $Ge_2H_6$.

In some embodiments, the boron precursor comprises a borane. Suitable boranes include $B_1$ to $B_{10}$ boranes, i.e. boranes containing 1 to 10 boron atoms per molecule, such as $B_2H_6$.

In some embodiments, the substrate is maintained at a temperature of at least 300° C. to at most 450° C. while the substrate is exposed to the precursors. In some embodiments, the substrate is maintained at a temperature of at least 200° C. to at most 400° C. For example, the reaction chamber may be maintained at a temperature of at least 200° C. to at most 430° C., or the reaction chamber may be maintained at a temperature of at least 200° C. to at most 410° C., or the reaction chamber may be maintained at a temperature of at least 220° C. to at most 390° C., or at a temperature of at least 240° C. to at most 380° C., or at a temperature of at least 260° C. to at most 360° C., or at a temperature of at least 280° C. to at most 350° C., or at a temperature of at least 300° C. to at most 340° C., or at a temperature of at least 320° C. to at most 330° C., or at a temperature of at least 300° C. to at most 380° C., or at a temperature of at least 320° C. to at most 360° C. These temperatures may be suitably measured by means of a thermocouple positioned in a susceptor on which the substrate is positioned in the reaction chamber. Additionally or alternatively, a substrate temperature may be measured by means of a pyrometer suspended in the reaction chamber and above the substrate.

In other words, and in some embodiments, the substrate is maintained at the aforementioned temperatures during the epitaxial deposition of the boron doped silicon germanium. These temperatures may also be maintained during any etch steps, if present.

It shall be understood that the substrate temperatures measured by a pyrometer suspended in the reaction chamber and above the substrate may differ from substrate temperatures measured by other means, such as substrate temperatures measured by means of a thermocouple in a support, e.g., susceptor, that supports the substrate in the reaction chamber during the methods as described herein. For example, a substrate temperature measured by means of such a thermocouple may be, e.g. from at least 20° C. to at most 100° C., or from at least 30° C. to at most 90° C., or from at least 40° C. to at most 70° C. lower than the substrate temperature measured by means of a pyrometer suspended in the reaction chamber and above the substrate. For example, a temperature of 375° C. as measured by a pyrometer suspended in the reaction chamber and above the substrate may correspond to a temperature of 320° C. as measured by a thermocouple positioned in a support, e.g., a susceptor, that supports the substrate in the reaction chamber.

In some embodiments, the reaction chamber is maintained at a pressure of at least 10 Torr to at most 160 Torr. In some embodiments, the reaction chamber is maintained at a pressure of at least 5 Torr to at most 740 Torr. In some embodiments, the reaction chamber is maintained at a pressure of at least 5 Torr to at most 160 Torr. In some embodiments, the reaction chamber is maintained at a pressure of at least 40 Torr to at most 160 Torr. In some embodiments, the reaction chamber is maintained at a pressure of at least 10 Torr to at most 200 Torr, or at a pressure of at least 10 Torr to at most 80 Torr, or at a pressure of at least 20 Torr to at most 80 Torr, or at a pressure of at least 80 Torr to at most 180 Torr, or at a pressure of at least 60 Torr to at most 100 Torr, or at a pressure of at least 40 Torr to at most 80 Torr, or at a pressure of at least 80 Torr to at most 115 Torr, or at a pressure of at least 115 Torr to at most 150 Torr. In other words, in some embodiments, the reaction chamber is maintained at any one of the aforementioned pressures during the epitaxial deposition of the boron doped silicon germanium.

The aforementioned pressures may also be maintained during any etch steps, if present. Thus, during a selective process comprising a sequence of deposition cycles (i.e., deposition cycles of boron doped silicon germanium) and etch cycles, the pressure during the etch cycles may be the same as the pressure used during the deposition cycles. This notwithstanding, and in some embodiments, the pressure during the etch cycles may be different than the pressure used during the deposition cycles. In some embodiments, the pressure during the etch cycles equals the pressure during the deposition cycles within a margin of error of 50%, or within a margin of error of 40%, or within a margin of error of 30%, or within a margin of error of 20%, or within a margin of error of 10%, or within a margin of error of 5%.

The present methods may allow for intrinsic selective growth of boron doped silicon germanium layers within a pre-determined selectivity window. In other words, the present methods may be used to selectively grow boron doped silicon germanium on one part of a substrate (e.g., a monocrystalline silicon surface), whereas no, or no substantial amount of, growth occurs on another part of that substrate (e.g., a silicon oxide surface). As used herein, the term "selectivity window" may refer to a thickness range of a grown layer in which the layer can be grown solely, or substantially solely, on one part of a substrate and not on one or more other parts of the substrate. Exemplary selectivity windows are 20 nm, 10 nm, 8 nm, 6 nm, 5 nm, 4 nm, 3 nm, 2 nm, and 1 nm. Thus, in some embodiments, the substrate comprises a first surface and a second surface. The first surface is a monocrystalline surface, and the second surface is a dielectric surface. The first surface preferably has a hydrogen termination. The first surface may comprise a surface of a doped layer, e.g., a boron-doped silicon layer. Alternatively, the first surface may comprise a surface of an undoped layer. In these methods, the boron doped silicon germanium layer is selectively and epitaxially grown on the first surface.

In other words, and in some embodiments, the boron doped silicon germanium can be selectively grown on a first surface comprised in a substrate, and not, or to a lesser degree, on a second surface comprised in that substrate. Suitably, the first surface can comprise a monocrystalline surface, and the second surface can comprise a dielectric surface that can, for example, be amorphous or polycrystalline. No additional method steps necessarily need to be applied, especially when a method as described herein is used for growing a relatively thin boron-doped silicon germanium layer. In such a case, kinetic mechanisms such as nucleation delay on the second surface can be used for selectively growing the boron-doped silicon-germanium on the first surface.

The first surface can, in some embodiments, comprise a semiconductor surface such as a silicon surface, a germanium surface, or a silicon germanium surface. In some embodiments, the monocrystalline surface comprises a monocrystalline silicon surface. In some embodiments, the monocrystalline surface comprises a monocrystalline silicon germanium surface.

The second surface can, in some embodiments, be selected from the list consisting of a silicon oxide surface, a silicon nitride surface, a silicon oxycarbide surface, a silicon oxynitride surface, a metal oxide surface, a metal nitride surface, a hafnium oxide surface, a zirconium oxide surface, and an aluminum oxide surface. In some embodiments, material exposed on the second surface can include, for example, a dielectric material, such as an oxide, a nitride, an oxynitride, an oxycarbide, an oxycarbide nitride, and/or the like, such as silicon nitride, silicon oxide ($SiO_2$), silicon carbide and mixtures thereof, such as SiOC, SiOCN, SiON. In some embodiments, the second area has a silicon oxide surface. In other words, in some embodiments, the second material consists of silicon oxide ($SiO_2$).

In some embodiments, the second surface comprises a dielectric surface. In some embodiments, the second surface may contain silicon and one or more species selected from carbon, nitrogen, and oxygen. In some embodiments, the second surface comprises a surface of an oxide, nitride, or carbide of an element selected from Hf, Zr, La, Al, and mixtures thereof. In some embodiments, the second surface comprises a metal oxide. In some embodiments, the second surface comprises a metal nitride. In some embodiments, the second surface comprises a metal carbide. In some embodiments, the second surface comprises metal nitride, metal oxide, and/or metal carbide bonds. In some embodiments, the second surface is selected from the list consisting of a silicon oxide surface, a silicon nitride surface, a silicon oxycarbide surface, a silicon oxynitride surface, a hafnium oxide surface, a zirconium oxide surface, and an aluminum oxide surface.

In some embodiments that enable selective growth, an etchant is provided to the reaction chamber while the silicon, germanium, and boron precursors are provided to the reaction chamber. Such an approach may enhance selectivity. Suitable etch gasses include halogen-containing compounds. Exemplary halogens include fluorine, chlorine, bromine, and iodine. In some embodiments, the etch gas comprises chlorine. Exemplary chlorine containing etch gasses include HCl and $Cl_2$. An exemplary bromine containing etch gas includes HBr. An exemplary iodine containing etch gas includes HI.

In some embodiments, relatively thick layers of boron-doped silicon germanium can be selectively grown on a first surface comprised in a substrate, and not on a second surface comprised in that substrate, by sequentially exposing the substrate to precursors and etchants. This can be particularly useful when exposing the substrate to the precursors results in growth of parasitic boron doped silicon germanium on the second surface. The parasitic boron doped silicon germanium can, for example, comprise parasitic boron doped silicon germanium nuclei and/or amorphous silicon germanium. Exposing the substrate to an etch gas can advantageously be used to remove the parasitic boron doped silicon germanium from the second surface. Removing the parasitic boron doped silicon germanium from the second surface can be accomplished by, for example, introducing an etch gas into the reaction chamber, or by moving the substrate to another reaction chamber, and exposing the substrate to an etch gas in that other reaction chamber. Introducing the etch gas into the reaction chamber, completely or substantially completely etches the parasitic boron doped silicon germanium, such as amorphous boron doped silicon germanium and/or boron-doped silicon germanium nuclei, in the second area while etching only part of the epitaxial boron doped silicon germanium layer in the first area.

In some embodiments, the step of depositing the boron doped silicon germanium layer and the etch step are separated by a purge step. In some embodiments, a purge step comprises exposing the substrate to a purge gas. Suitable purge gasses include nitrogen and the noble gasses. Suitable noble gasses may include He, Ne, Ar, Kr, and Xe. In some embodiments, the purge gas consists of $N_2$. In some embodiments, the purges last from at least 5.0 s to at most 80.0 s, or from at least 10.0 s to at most 40.0 s, or from at least 15.0 to at most 30.0 s, or for about 20.0 s. In some embodiments, the purge gas is provided to the reaction chamber during the purges at a flow rate of at least 2000 to at most 60 000 sccm, or of at least 5 000 to at most 20 000 sccm, or of at least 8000 to at most 12000 sccm.

Suitable etch gasses include halogen-containing gasses such as HCl, $Cl_2$, and HBr. In other words, suitable etch gasses include halogen-containing compounds. Exemplary halogens include fluorine, chlorine, bromine, and iodine. In some embodiments, the etch gas comprises chlorine. Exemplary chlorine containing etch gasses include HCl and $Cl_2$. An exemplary bromine containing etch gas includes HBr.

A method as described herein can comprise one and only one sequence of depositing boron-doped silicon-germanium on a first surface and etching parasitic boron-doped silicon germanium from the second surface. Alternatively, a method as described herein can comprise a plurality of such deposition-etch cycles. A deposition-etch cycle comprises a step of introducing the silicon precursor, the germanium precursor, and the boron precursor into the reaction chamber and a step of introducing an etch gas into the reaction chamber. The number of deposition-etch cycles can be suitably selected to arrive at a boron doped epitaxial silicon germanium layer on the first surface having a pre-determined thickness. For example, a method as described herein can comprise from at least 1 to at most 1000 deposition-etch cycles, from at least 2 to at most 100 deposition-etch cycles, from at least 2 to at most 50 deposition-etch cycles, from at least 2 to at most 30 deposition-etch cycles, from at least 2 to at most 20 deposition-etch cycles, or from at least 5 to at most 15 deposition-etch cycles, or from at least 8 to at most 12 deposition-etch cycles.

The temperature and/or pressure that is maintained during the etching step can be the same or similar to the temperature and/or pressure described above in connection with the deposition step. In other words, and in some embodiments, at least one of temperature and pressure are kept constant throughout the deposition cycles and the etch cycles, i.e., throughout the boron doped silicon germanium deposition steps and the etch steps.

In some embodiments, etch cycles and deposition cycles can be executed at different pressures. In other words, in some embodiments, the step of depositing the boron doped silicon germanium layer and the step etching may be at different pressures. Preferably, the aforementioned pressures differ by no more than 10%, or by no more than 20%, or by no more than 50%, or by no more than 100%, or by no more than 200%, or by no more than 500%, or by no more than 1000%, relative to the lowest pressure that occurs. Keeping the pressure differences limited in this way may speed up processing time by limiting the amount of time needed for pumping between the cycles.

In an advantageous embodiment, for example when $Cl_2$ is used as an etch gas, the pressure during an etch cycle is less than 90 Torr, e.g., from at least 5 Torr to at most 90 Torr, or from at least 0.5 Torr to at most 1.0 Torr, or from at least 1.0 Torr to at most 2.0 Torr, or from at least 2.0 Torr to at most 5.0 Torr, or from at least 5.0 Torr to at most 10.0 Torr, or from at least 10.0 Torr to at most 20.0 Torr, or from at least 20.0 Torr to at most 40.0 Torr, or from at least 40.0 Torr to at most 60.0 Torr, or from at least 60.0 Torr to at most 90.0 Torr. Doing so can enhance the safety of some embodiments of the present methods. In some embodiments, the pressure during a deposition cycle is the same as the pressure of an etch cycle. Alternatively, the pressure during a deposition cycle may be different from the pressure used during an etch cycle.

Without the invention being bound by any theory or specific mode of operation, it shall be understood that selectivity may be obtained through any one or a combination of the following mechanisms: 1) amorphous boron doped silicon germanium grows at a slower rate on a second surface than epitaxial boron doped silicon germanium on a first surface; 2) amorphous boron doped silicon germanium growth on the second surface exhibits delayed growth, i.e., nucleation delay, with respect to epitaxial boron doped silicon germanium in the first surface; and 3) amorphous boron doped silicon germanium on the second surface is etched at a faster rate than epitaxial boron doped silicon germanium on the first surface. Thus, an epitaxial boron doped silicon germanium layer may be grown on the first surface whereas no silicon germanium layer is formed on the second surface. In other words, an epitaxial boron doped silicon germanium film is grown on a first surface whereas after deposition, no or no substantial amount of amorphous boron doped silicon germanium remains on a second surface.

In some embodiments, the etchant comprises an elementary halogen. In some embodiments, the etchant comprises HCl. In some embodiments, the etchant comprises chlorine. In other words, $Cl_2$ is used in some embodiments as an etchant. In some embodiments, $Cl_2$ is provided during the etch cycles to the reaction chamber at a flow rate from at least 5.0 sccm to at most 400.0 sccm, or from at least 5.0 sccm to at most 200.0 sccm or from at least 5.0 sccm to at most 100.0 sccm, or from at least 10.0 sccm to at most 50.0 sccm, or from at least 15.0 sccm to at most 40.0 sccm, or from at least 20.0 sccm to at most 30.0 sccm.

In some embodiments, the etch steps may last from at least 1.0 s to at most 400.0 s, or from at least 2.0 s to at most 200.0 s, or from at least 4.0 s to at most 100.0 s, or from at least 8.0 s to at most 50.0 s, or from at least 10.0 s to at most 40.0 s, or from at least 20.0 s to at most 30.0 s.

In advantageous embodiments, an etch steps lasts less than 130 s, or less than 110 s, or less than 90 s, or less than 70 s, or less than 50 s, or less than 30 s, or less than 20 s, or less than 10 s, or less than 5 s. Such short etch times can advantageously improve surface roughness.

In an exemplary etch step, chlorine ($Cl_2$) may be used as an etchant, and may be provided to the reaction chamber at a flow rate of at least 5 sccm to at most 20 sccm, or of at least 7 sccm to at most 15 sccm, or of about 10 sccm. The pressure during the etch pulse may be from at least 20 Torr to at most 80 Torr, or at least 30 Torr to at most 60 Torr, for example around 40 Torr. A $Cl_2$ flow of 10 sccm at 40 Torr may yield an etch rate of around 8 nm/min.

In some embodiments, a boron doped silicon germanium layer as described herein has a resistivity of at most 0.2 mOhm·cm. In some embodiments, a boron doped silicon germanium layer as described herein has a resistivity of at most 0.19 mOhm·cm. In some embodiments, a boron doped silicon germanium layer as described herein has a resistivity of at most 0.18 mOhm·cm. In some embodiments, a boron doped silicon germanium layer as described herein has a resistivity of at most 0.17 mOhm·cm. In some embodiments, a boron doped silicon germanium layer as described herein has a resistivity of at most 0.16 mOhm·cm. In some embodiments, a boron doped silicon germanium layer as described herein has a resistivity of at most 0.15 mOhm·cm. In some embodiments, a boron doped silicon germanium layer as described herein has a resistivity of at most 0.14 mOhm·cm. In some embodiments, a boron doped silicon germanium layer as described herein has a resistivity of at most 0.13 mOhm·cm.

In some embodiments, the method further comprises introducing a carrier gas into the reaction chamber. This can be particularly useful when, for example, hard to volatilize precursors are used, in which case a carrier gas can help with bringing the precursors to the reaction chamber. For example, a boron precursor such as diborane may be provided to the reaction chamber aided by a carrier gas. For example, a silicon precursor such as a halosilane may be provided to the reaction chamber aided by a carrier gas. For example, a germanium precursor such as germane may be provided to the reaction chamber aided by a carrier gas. For example, an etch gas such as HCl, $Cl_2$, or HBr may be provided to the reaction chamber aided by a carrier gas. In some embodiments, the carrier gas essentially consists of one or more inert gasses. In some embodiments, the carrier gas is selected from the list consisting of noble gasses and nitrogen. In some embodiments, the carrier gas is selected from the list consisting of $H_2$, $N_2$, He, Ne, Kr, Ar, and Xe. In some embodiments, the carrier gas essentially consists of $N_2$. In some embodiments, the carrier gas consists of $N_2$. In some embodiments, the carrier gas comprises $H_2$. In some embodiments, the noble gas comprises helium. In some embodiments, the noble gas comprises krypton. In some embodiments, the noble gas comprises neon. In some embodiments, the noble gas comprises argon. In some embodiments, the noble gas comprises xenon. In some embodiments, $N_2$ is used as a carrier gas. In some embodiments, the carrier gas is provided to the reaction chamber at a flow rate from at least 1.0 slm to at most 100 slm, or from at least 2.0 slm to at most 30 slm, or from at least 2.0 slm to at most 50 slm, or from at least 5.0 slm to at most 20.0 slm, or from at least 8.0 slm to at most 12.0 slm.

In some embodiments, the carrier gas is provided to the reaction chamber at a flow rate of at least 2.0 slm to at most 30 slm, or of at least 5 slm to at most 20 slm (standard liters per minute).

In some embodiments, the silicon precursor is provided to the reaction chamber at a flow rate of at least 5 to at most 600 sccm. In some embodiments, the silicon precursor is provided to the reaction chamber at a flow rate of at least 300 to at most 450 sccm (standard cubic centimeters per minute).

In some embodiments, the germanium precursor is provided to the reaction chamber at a flow rate of at least 50 to at most 2000 sccm. In some embodiments, the germanium precursor is provided to the reaction chamber at a flow rate of at least 100 to at most 1000 sccm, or at a flow rate of at least 200 to at most 500 sccm. In some embodiments, the germanium precursor is provided to the reaction chamber at a flow rate of at least 350 to at most 2000 sccm.

In some embodiments, the boron precursor is provided to the reaction chamber at a flow rate of at least 1 sccm to at most 50 sccm. In some embodiments, the boron precursor is provided to the reaction chamber at a flow rate of at least 0.5 sccm to at most 120 sccm. In some embodiments, the boron precursor is provided to the reaction chamber at a flow rate of at least 0.5 sccm to at most 60 sccm. In some embodiments, the boron precursor is provided to the reaction chamber at a flow rate of at least 1.0 sccm to at most 60 sccm. In some embodiments, the boron precursor is provided to the reaction chamber at a flow rate of at least 1.0 sccm to at most 40 sccm. In some embodiments, the boron precursor is provided to the reaction chamber at a flow rate of at least 5 sccm to at most 20 sccm. In some embodiments, the boron precursor is provided to the reaction chamber at a flow rate of at least 5 sccm to at most 30 sccm. In some embodiments, the boron precursor is provided to the reaction chamber at a flow rate of at least 5 sccm to at most 45 sccm. In some embodiments, the boron precursor is provided to the reaction chamber at a flow rate of at least 10 sccm to at most 50 sccm. In some embodiments, the boron precursor is provided to the reaction chamber at a flow rate of at least 1 sccm to at most 100 sccm. In some embodiments, the boron precursor is provided to the reaction chamber at a flow rate of at least 5 sccm to at most 25 sccm. In some embodiments, the boron precursor is provided to the reaction chamber at a flow rate of at least 15 sccm to at most 25 sccm.

It shall be understood that the present methods may be carried out after any suitable pre-clean. One possible pre-clean is a gas-phase pre-clean, e.g., a plasma clean that results in an H-terminated silicon surface. Another possible pre-clean uses wet chemistry. For example, the following sequence may be used: surface oxidation in a mixture consisting of $NH_4OH$, $H_2O_2$, and $H_2O$; followed by a rinse; followed by an HF dip; followed by a rinse. A suitable HF dip comprises, for example, a dip in a mixture consisting of from at least 0.1 vol.% to at most 1.5 vol. % HF in water, e.g., distilled or deionized water. Additionally or alternatively, a gas-phase pre-dean may be used.

Further described herein is a system comprising one or more reaction chambers, a gas injection system, and a controller configured for causing the system to perform a method as described herein.

Further described herein is a field effect transistor that comprises a boron doped silicon germanium layer as a source region, a drain region, or both. The boron doped silicon germanium layer is deposited by means of a method as described herein. Exemplary field effect transistors includes FinFETs, gate all around transistors, and stacks comprising multiple transistor devices.

Further described herein is a method for epitaxially growing a boron doped silicon germanium bilayer. The bilayer comprises a lowly doped layer and a highly doped layer. The method comprises providing a substrate in, or to, a reaction chamber. The substrate comprises a monocrystalline surface, such as a monocrystalline silicon surface or a monocrystalline silicon-germanium surface. The method further comprises epitaxially forming the lowly doped layer on the substrate. The method further comprises epitaxially forming the highly doped layer on the lowly doped layer. Epitaxially forming the lowly doped layer comprises exposing the substrate to a first silicon precursor, a first germanium precursor, and a first boron precursor. Epitaxially forming the highly doped layer comprises exposing the substrate to a second silicon precursor, a second germanium precursor, and a second boron precursor. While forming the lowly doped layer and while forming the highly doped layer, the substrate is maintained at a temperature of at most 450° C. At least one of the first silicon precursor and the second silicon precursor comprises a halosilane.

In some embodiments, the first silicon precursor comprises one or more silicon precursors as described herein.

In some embodiments, the first germanium precursor comprises one or more silicon precursors as described herein.

In some embodiments, the first boron precursor comprises one or more silicon precursors as described herein.

In some embodiments, the second silicon precursor comprises one or more silicon precursors as described herein.

In some embodiments, the second germanium precursor comprises one or more silicon precursors as described herein.

In some embodiments, the second boron precursor comprises one or more silicon precursors as described herein.

In some embodiments, the lowly doped layer is formed using a method as described herein.

In some embodiments, the highly doped layer is formed using a method as described herein.

In some embodiments, the first silicon precursor substantially consists of a silane and a halosilane.

In some embodiments, the first silicon precursor substantially consists of $SiH_4$ and $SiH_2Cl_2$.

In some embodiments, the second silicon precursor substantially consists of $SiH_2Cl_2$.

In some embodiments, the first germanium precursor and the second germanium precursor comprise $GeH_4$.

In some embodiments, the first boron precursor and the second boron precursor comprises $B_2H_6$.

In some embodiments, forming the lowly doped layer comprises executing a plurality of deposition-etch cycles. A deposition-etch cycle comprises a step of introducing the first silicon precursor, the first germanium precursor, and the first boron precursor into the reaction chamber. A deposition-etch cycle further comprises a step of introducing a first etch gas into the reaction chamber. In other words, a deposition-etch cycle can comprise a deposition step and an etch step. Suitable deposition-etch cycles are described in more detail elsewhere herein.

In some embodiments, forming the highly doped layer comprises executing a plurality of deposition-etch cycles. A deposition-etch cycle comprises a step of introducing the first silicon precursor, the first germanium precursor, and the first boron precursor into the reaction chamber. A deposition-etch cycle further comprises a step of introducing a first etch gas into the reaction chamber. In other words, a deposition-etch cycle can comprise a deposition step and an etch step. Suitable deposition-etch cycles are described in more detail elsewhere herein.

In some embodiments, the lowly doped layer has a thickness of at least 5 nm to at most 100 nm, or of at least 5 nm to at most 10 nm, or of at least 10 nm to at most 20 nm, or of at least 20 nm to at most 50 nm, or of at least 50 nm to at most 100 nm.

In some embodiments, the highly doped layer has a thickness of at least 5 nm to at most 100 nm, or of at least 5 nm to at most 10 nm, or of at least 10 nm to at most 20 nm, or of at least 20 nm to at most 50 nm, or of at least 50 nm to at most 100 nm.

In some embodiments, the lowly doped layer has a resistivity of at least 0.15 mOhm·cm to at most 0.30 mOhm·com.

In some embodiments, the highly doped layer has a resistivity of at most 0.14 mOhm·cm, such as a resistivity of at least 0.10 mOhm·cm to at most 0.14 mOhm·cm.

In a first example, reference is made to FIG. 1. FIG. 1 illustrates a (e.g., selective) deposition method (100) in accordance with exemplary embodiments of the disclosure. The method (100) includes the steps of providing a substrate within a reaction chamber (step 102), selectively or non-selectively depositing a boron doped silicon germanium layer (step 104), an optional etching step (step 108), optionally repeating the deposition steps (104) and the etching step (108) (loop 110), and ending (step 112).

Figure 2:
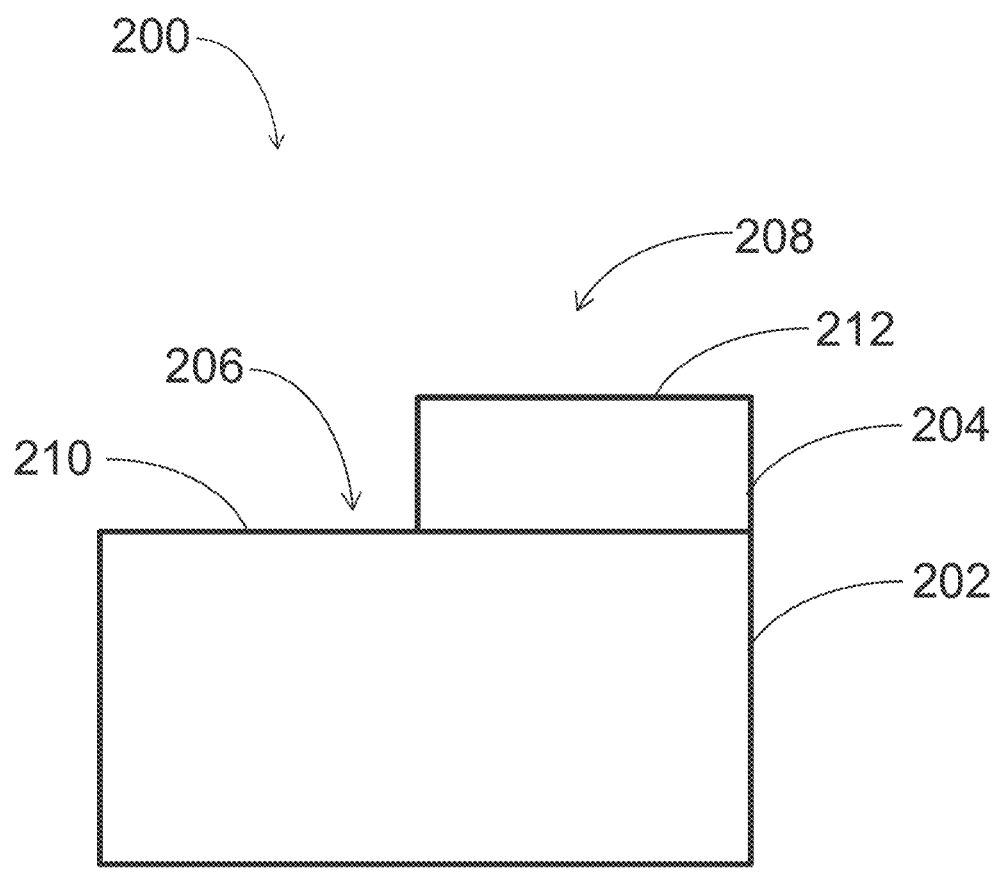
FIG. 2 illustrates a substrate (200) on which boron doped silicon germanium layer may be deposited in accordance with exemplary embodiments of the disclosure.

With reference to FIG. 1 and FIG. 2, a substrate (200) provided during step (102) can include a first area (206) comprising a first material (e.g., (mono)-crystalline bulk material (202)) and a second area (208) comprising a second material (e.g., non-monocrystalline material (204)). The first material can include a monocrystalline surface (210); second area (208) can include a non-monocrystalline surface (212), such as a polycrystalline surface or an amorphous surface. The monocrystalline surface (210) may be a monocrystalline silicon surface. Additionally or alternatively, the monocrystalline surface (210) may comprise a monocrystalline silicon germanium surface. Additionally or alternatively, the monocrystalline surface (210) may comprise a boron doped silicon germanium surface. Additionally or alternatively, the monocrystalline surface (210) may comprise a boron doped silicon germanium surface.

The non-monocrystalline surface (212) may include, for example, dielectric materials, such as oxides, oxynitrides, nitrides, oxycarbides, or oxycarbide nitrides, including, for example, silicon oxides, silicon nitrides, silicon oxynitrides, silicon carbides and mixtures thereof, such as SiOC, SiOCN, and SiON.

As a non-limiting example, the reaction chamber used during the step (102) of providing the substrate may comprise a reaction chamber of a deposition system that is specifically arranged for chemical vapor depositions. This notwithstanding, other reaction chambers and alternative chemical vapor deposition systems may also be utilized to perform the embodiments of the present disclosure. The reaction chamber can be a stand-alone reaction chamber or it can be a part of a cluster tool. The substrate providing step (102) can include heating the substrate to a desired deposition temperature within the reaction chamber. In some embodiments of the disclosure, the substrate providing step (102) includes heating the substrate to a temperature of less than approximately 450° C., or even to a temperature of less than approximately 400° C. The deposition temperature can be maintained throughout the step of depositing the boron doped silicon germanium layer (104), and the optional etching step (108).

Figure 3:
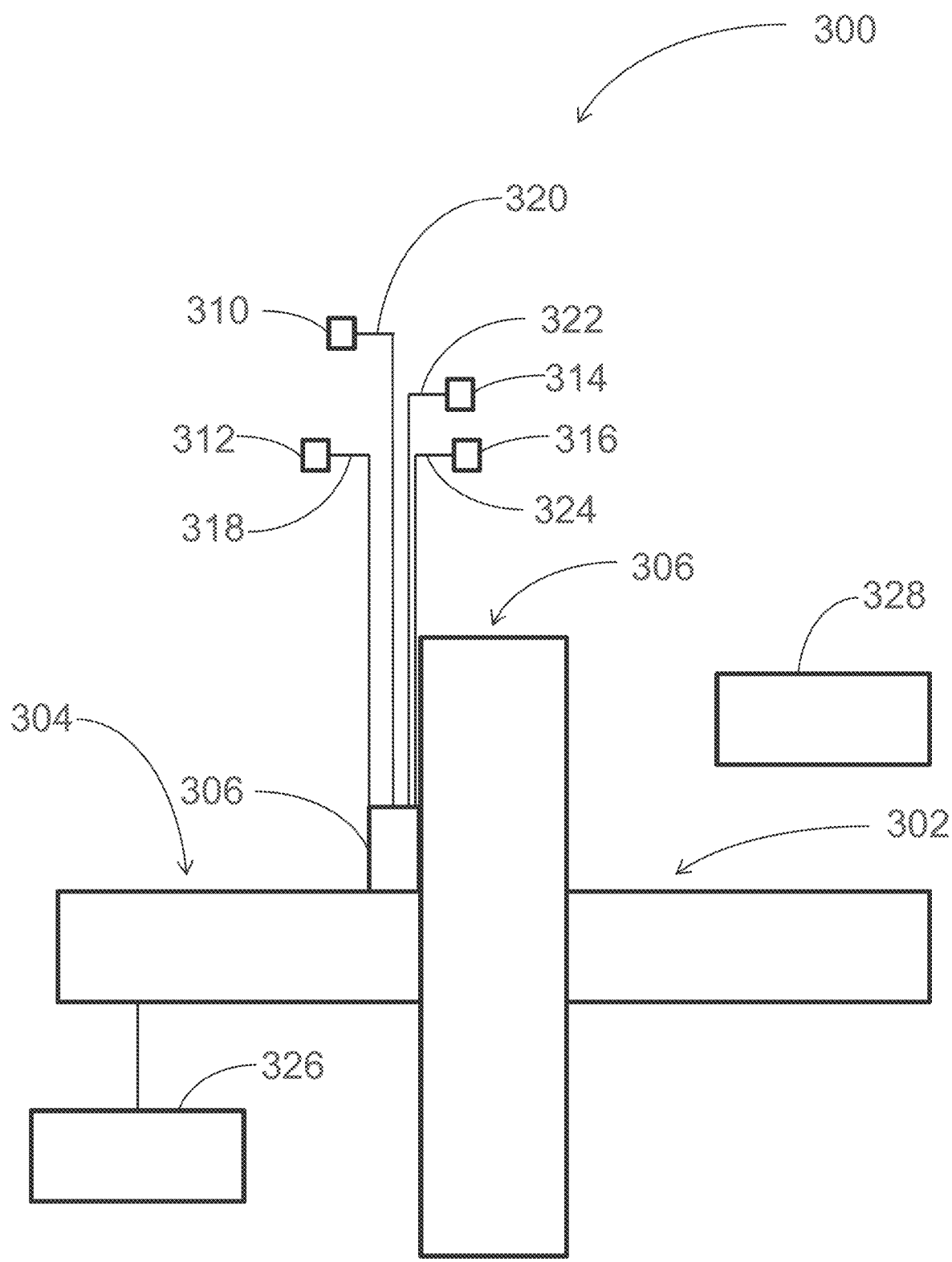
FIG. 3 illustrates a system (300) in accordance with additional exemplary embodiments of the disclosure.

FIG. 3 illustrates a system (300) in accordance with yet additional exemplary embodiments of the disclosure. The system (300) can be used to perform a method as described herein and/or form a structure or device portion as described herein.

In the illustrated example, the system (300) includes an optional substrate handling system (302), one or more reaction chambers (304), a gas injection system (306), and optionally a wall (308) disposed between reaction chamber(s) (304) and substrate handling system (302). The system (300) can also include a first gas source (310), a second gas source (312), a third gas source (314), a fourth gas source (316), an exhaust (326), and a controller (328). At least one of the first through fourth gas sources includes a silicon precursor source. The silicon precursor may be disilane. At least one of the first through fourth gas sources includes a carrier gas source, for example, a $N_2$ source. At least one of the first through the fourth gas sources includes a germanium precursor source. The germanium precursor may be germane. At least one of the first through fourth gas sources includes a boron precursor source. The boron precursor may be diborane.

Although illustrated with four gas sources (310-316), the system (300) can include any suitable number of gas sources. The gas sources (310-316) can each include, for example, precursor gasses, e.g., the silicon, germanium, and boron precursors mentioned herein, including mixtures of such precursors and/or mixtures of one or more precursors with a carrier gas. Additionally, one of the gas sources (310-316) or another gas source can include an etchant, such as an elementary halogen—e.g., chlorine. Gas sources (310)-(316) can be coupled to the reaction chamber (304) via lines (318)-(324), which can each include flow controllers, valves, heaters, and the like.

The system (300) can include any suitable number of reaction chambers (304) and substrate handling systems (302). Further, one or more reaction chambers (304) can be or can include a cross-flow, cold wall epitaxial reaction chamber.

The vacuum source (326) can include one or more vacuum pumps.

The controller (328) can be configured to perform various functions and/or steps as described herein. In particular, the controller (328) can be configured for causing the system (300) to perform a method for epitaxially growing a boron doped silicon germanium layer as described herein.

A controller (328) can include one or more microprocessors, memory elements, and/or switching elements to perform the various functions. Although illustrated as a single unit, the controller (328) can alternatively comprise multiple devices. By way of examples, the controller (328) can be used to control gas flow (e.g., by monitoring flow rates of precursors and/or other gases from the gas sources (310-316) and/or controlling valves, motors, heaters, and the like). Further, when the system (300) includes two or more reaction chambers, the two or more reaction chambers can be coupled to the same/shared controller.

During operation of reactor system (300), substrates, such as semiconductor wafers (not illustrated), are transferred from, e.g., a substrate handling system (302), to a reaction chamber (304). Once substrate(s) are transferred to the reaction chamber (304), one or more gases from gas sources (310-316), such as precursors, dopants, carrier gases, and/or purge gases, are introduced into the reaction chamber (304) via a gas injection system (306). A gas injection system (306) can be used to meter and control gas flow of one or more gases (e.g., from one or more gas sources (310-316)) during substrate processing and to provide desired flows of such gas(es) to multiple sites within the reaction chamber (304).

In an exemplary embodiment, a boron-doped silicon germanium layer is deposited at a temperature of at least 300° C. to at most 450° C., e.g. at a temperature of 360° C., as measured by a thermocouple positioned in a susceptor that serves as a substrate support. Dichlorosilane is used as a silicon precursor, germane is used as a germanium precursor, and diborane is used as a boron precursor. At a temperature of 400° C. or less, the process can have a nucleation delay, e.g., 5 to 10 nm, when growth on monocrystalline silicon (faster) is compared to growth on a dielectric such as silicon nitride or silicon oxide (slower). Such nucleation delay can be used to grow thin boron-doped silicon germanium layers selectively on monocrystalline silicon versus a dielectric. Alternatively, it can be used to grow thicker layers using a deposition—etch process, that may or may not be cyclic, depending on the desired thickness of the deposited layer.

In some embodiments when a deposition—etch process is used, a halogen-containing etchant, such as a chlorine-containing etchant, such as $Cl_2$ may be advantageously used. Note that the terms etchant and etching gas as used herein can be used interchangeably. A cyclic deposition process may suitably describe alternating growth pulses and etch pulses. During the growth pulses, a gas mixture comprising dichlorosilane, germane, and diborane is provided to the reaction chamber. During the etch pulses, a gas mixture comprising an etchant is provided to the reaction chamber. In some embodiments, the growth pulses and the etch pulses are separated by a purge. During a purge, a substantially inert gas or a mixture of inert gasses can be provided to the reaction chamber, thereby removing reactive species such as precursors and etchants from the reaction chamber.

Figure 4:
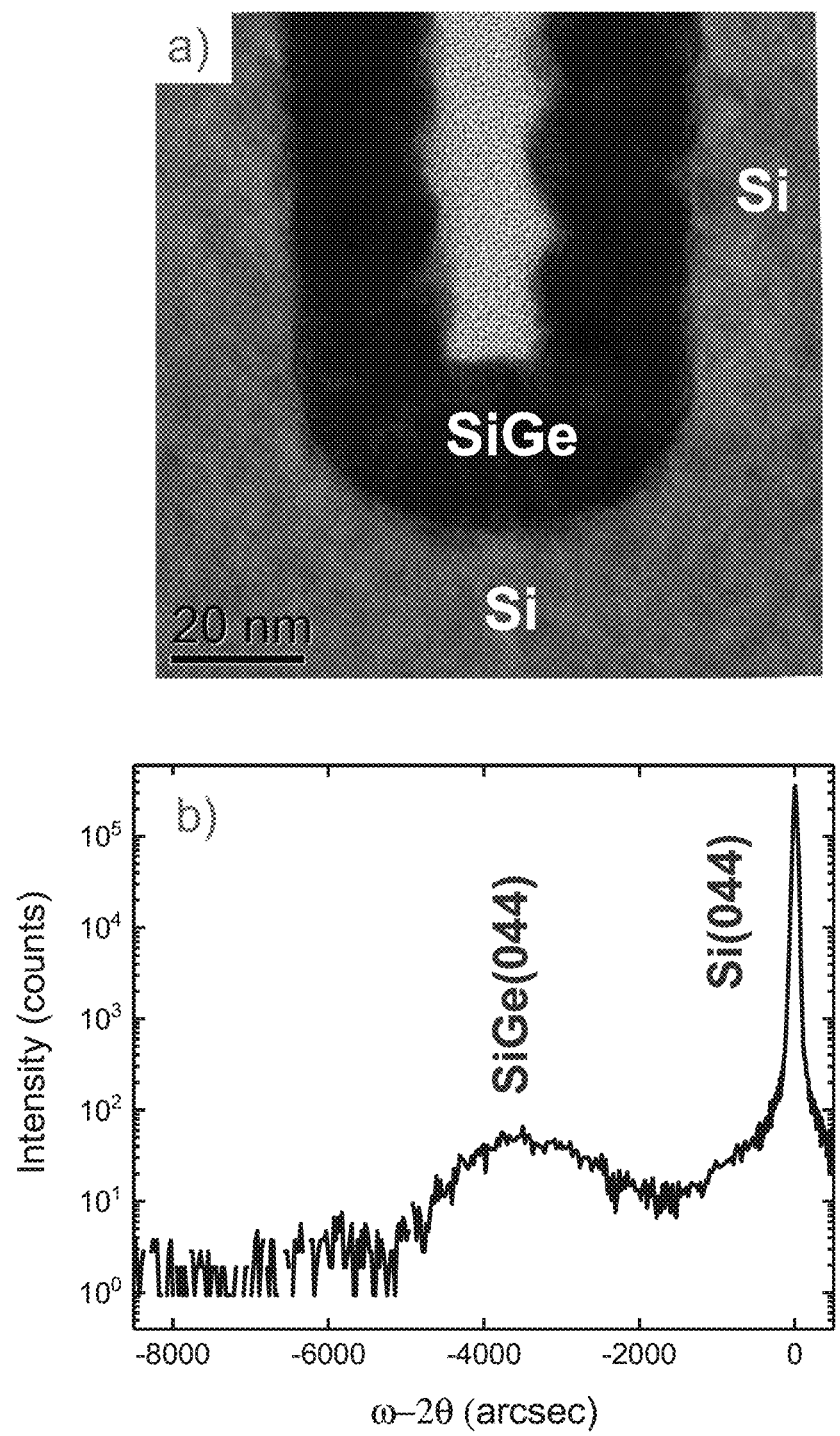
FIG. 4 shows a transmission electron micrograph of a boron-doped silicon germanium layer that was deposited by means of a method as described herein. In addition.

FIG. 4 panel a) shows a transmission electron microscopy image of a layer deposited by a method as described herein in a trench. The trench has a bottom (100)Si surface, and (110)Si sidewalls. A boron doped silicon germanium layer was formed on the bottom (100)Si surface and on the (110)Si sidewalls. It is relatively smooth on the bottom, and some roughness is observed on the sidewalls. Epitaxial growth is observed on both surface orientations: the boron doped silicon germanium layer is crystalline on both the bottom (100)Si surface and on the (110)Si sidewalls. The layer was deposited using dichlorosilane as a silicon precursor, germane as a germanium precursor, and diborane as a boron precursor, at a substrate temperature of 360° C., as measured by a thermocouple in a susceptor that serves as a substrate support in the reaction chamber, and at a pressure of 60 Torr. Dichlorosilane was provided to the reaction chamber at a flow rate of 375 sccm, germane was provided to the reaction chamber at a flow rate of 350 sccm, and diborane was provided to the reaction chamber at a flow rate of 10 sccm. The above process resulted in a layer having a thickness of 23 nm on the Si(110) sidewalls, and a thickness of 20 nm on the Si(001) bottom, indicating a substantially similar growth rate on these two crystal orientations.

FIG. 4 panel b) shows X-Ray Diffraction (XRD) measurements performed a boron-doped silicon germanium layer that was deposited by means of a method as described herein, and in particular by means of a method that was also used for depositing the sample shown in FIG. 4 panel a). The XRD measurements indicate a clear SiGeB peak with well-defined thickness fringes; indicating high quality crystalline layers on both Si(110) and Si(100) surfaces. The Si(110) crystallinity determination was done using the Si(044) peak in the XRD spectrum. Grown on Si(100) surfaces, this layer had an apparent Ge content of 41 atomic percent and a resistivity of 0.13±0.005 mOhm·cm as measured by means of sheet resistance measurements and X-ray reflectivity for thickness measurement. Thus, a method as described herein surprisingly allows growing boron-doped silicon germanium layers having a very low resistivity.

It shall be understood that whenever flow rates of precursors, reactants, carrier gasses, purge gasses, and the like are provided, they are provided for reactors arranged for processing 300 mm wafers. A skilled artisan understands that such flow rates can be readily modified for other substrates.

As discussed above, the inventors recognized that with advancing CMOS and other technologies that it may become increasingly useful to provide processes that can make use of a lower epitaxial (EPI) temperatures. This lower temperature may be in any of the ranges provided above with a maximum temperature of less than 450° C., less than 420° C., and even more preferably less than 400° C. For example, the use of a maximum EPI temperature of at most 400° C. can be desirable to enable various novel integration schemes, e.g., stacking devices, a buried power rail, a high-k/metal gate, a source/drain (S/D) contact layer, and the like.

The inventors further observed that epitaxially growing monocrystalline material on Si(110) crystal faces is very challenging, even under conditions that can result in epitaxial growth on Si(100) crystal faces, and careful optimization of process conditions can be used to achieve a smooth and crystalline SiGe layer. Earlier in this description, a deposition method with lower temperatures used for epitaxially growing a boron doped silicon germanium layer on a monocrystalline surface was described that utilized a precursor such as a halosilane, more specifically a chlorosilane, and even more specifically dichlorosilane (or "DCS") as the silicon source or precursor, and this method was useful for epitaxially growing silicon germanium on both (110)Si crystal faces and (100)Si crystal faces.

Further, as noted above, it was believed by the inventors that it would be useful to include an additional material to the Si precursor to improve growth on the Si(110) sidewalls. With this solution in mind, as discussed below, the inventors tested the desirability of adding silane (e.g., $SiH_4$) at a moderate flow rate to the silicon precursor (e.g., DCS) or as a second Si precursor. The testing showed an increase in the growth rate and in the ability to maintain the crystallinity of the boron doped silicon germanium (SiGe:B) layer on the monocrystalline surface (e.g., Si(110) sidewalls).

Based on the results of this testing, a particular implementation of the method 100 will be described that is useful to obtain selective SiGe:B layers via epitaxial growth using DCS, silane (e.g., $SiH_4$), and a germanium precursor (e.g., $GeH_4$ or another of the Ge precursors listed above) as precursors for processes with temperatures below 450° C. and, in some useful implementations, below 400° C. This implementation of the method (100) includes cyclical deposition and etch steps (104) and (108) to reach a desired thickness while maintaining selectivity. The method (100) may also include fine tuning (as discussed below) the processes parameters within, typically, the ranges described herein, to enable SiGe:B epitaxial growth without any degradation after etching. These parameters include precursor gas flows (e.g., borane precursor (e.g., diborane) flow), carrier flow, pressures, etch gas (e.g., $Cl_2$) flow, and etch duration. This implementation of the method (100) is likely suitable for envisioned future technology nodes for epitaxial SiGe:B S/D and other applications. Further, it is selective towards oxide, inner spacer nitride, and SiN, which can be desired by those skilled in the arts.

To facilitate lower temperature (e.g., 400° C. or lower within the ranges listed herein) epitaxial growth processes, the precursors may preferably be selected while also tuning the process parameters to achieve SiGe:B growth on Si(110), Si(001), and the like. Particularly, the silicon source or precursor may be a halosilane such as DCS combined with a silane such as $SiH_4$. The germanium source or precursor may be a germane such as $GeH_4$, and the boron source or precursor may be a borane such as $B_2H_6$. The carrier gas may be a noble gas, $N_2$, $H_2$, or the like while the etch gas may be $Cl_2$ in $N_2$ or the like.

The process parameters may be in the ranges provided above at the lower temperatures (e.g., 400° C. or lower), with some useful and even optimized parameters being chosen to be: (1) the boron precursor flow rate may be in the range of 1 to 100 sccm such as 15 to 25 sccm; (2) pressure may be maintained in the range of 10 to 80 Torr such as in the range of 10 to 20 Torr; (3) short deposition duration (e.g., step (104) in method (100) of FIG. 1 may have a duration of about 30 to 60 seconds), which can enable growing 1.5 to 3 nm per cycle; (4) a short etch cycle (e.g., step (108) in method (100) of FIG. 1), which may use $Cl_2$ in $N_2$ for a duration of 3 to 5 seconds to etch 0.5 to 1 nm per cycle; (5) the Ge content may be varied to be between 25 to 80 atomic percent; and (6) the number of cycles (deposition (104) and/or etch (108)) may be repeated a desired number (or n) times to reach a desired thickness. By tuning process conditions, SiGe:B epitaxial growth can be successfully achieved resulting in a crystalline layer on both Si(110) and Si(001) with low surface roughness.

Figure 5B:
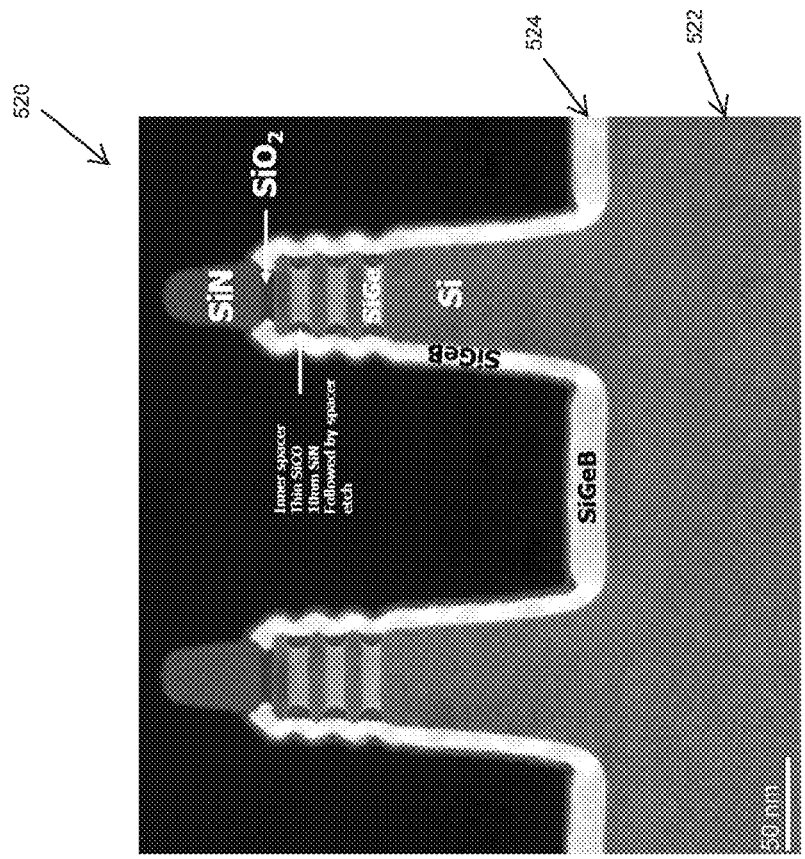
FIGS. 5A and 5B show transmission electron micrographs of boron-doped silicon germanium layers deposited, respectively, in non-selective and selective processes as described herein.
Figure 5A:
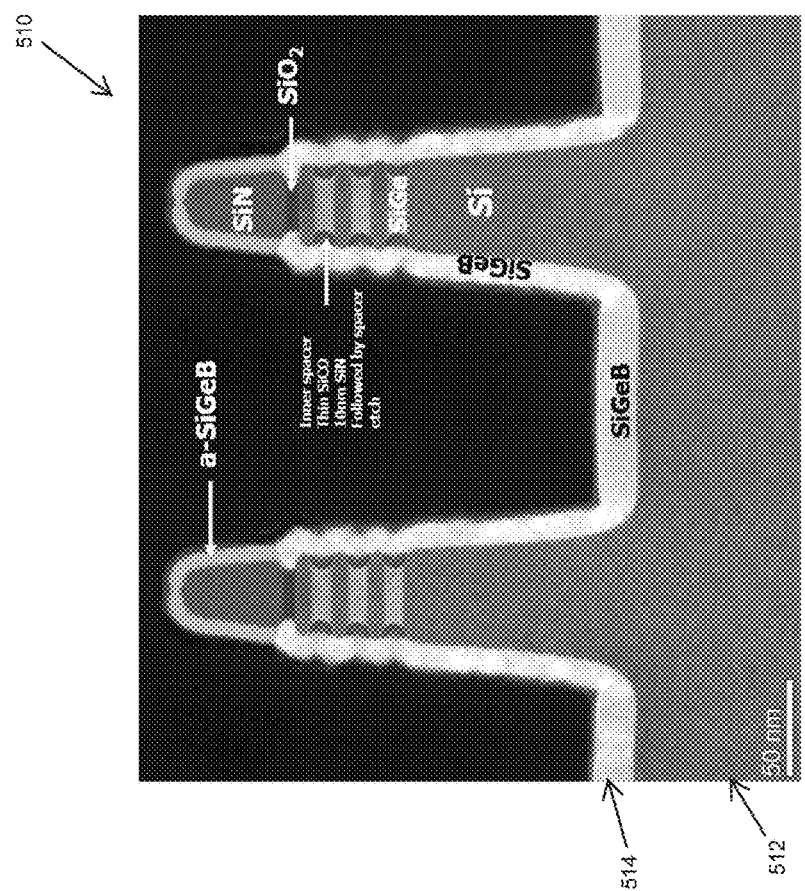

FIGS. 5A and 5B show transmission electron microscopy (TEM) micrographs (510) and (520) of boron-doped silicon germanium layers deposited, respectively, in non-selective and selective processes as described herein. Particularly, a gate-all-around (GAA) architecture is shown with substates (512) and (522) upon which layers (514) and (524) of SiGe:B are epitaxially grown at temperatures at or below about 400° C. utilizing the precursors and tuned parameters discussed above, including use of a silicon precursor of DCS and $SiH_4$.

The TEM images (510) and (520) show that neither the morphology nor the crystal quality was degraded for the selective process compared to the non-selective process. It is believed that these results were achieved largely due to the fine tuning of etch conditions and other growth parameters and precursors. The test results are achievable, for example, using an etch duration fixed to 5 seconds over 10 deposition-etch cycles. Testing further showed that for this process the thickness fringes were still present and the layer resistivity remained at around 0.2 mOhm·cm, and as low as 0.18 mOhm·cm, after etching for the selective process. Useful results were obtained with other short deposition and etch durations, where the process seemed quite stable, including a 30 second deposition period followed by a 3 second etch (over some number, e.g., 20, of cycles) and also including a 40 second deposition period followed by a 3 second etch (over some number, e.g., 20, of cycles). Such short etch duration was shown to be useful to maintain good crystallinity (as is attested by the thickness fringes shown in X-Ray Diffraction (XRD) measurements of fabricated structures including transistors). The process also proved to provide a very smooth surface morphology, e.g., by microscopy (such atomic force microscopy (AFM)), an root mean square (RMS)=0.15 nm with $Z_{max}$=1.4 nm.

Figure 6:
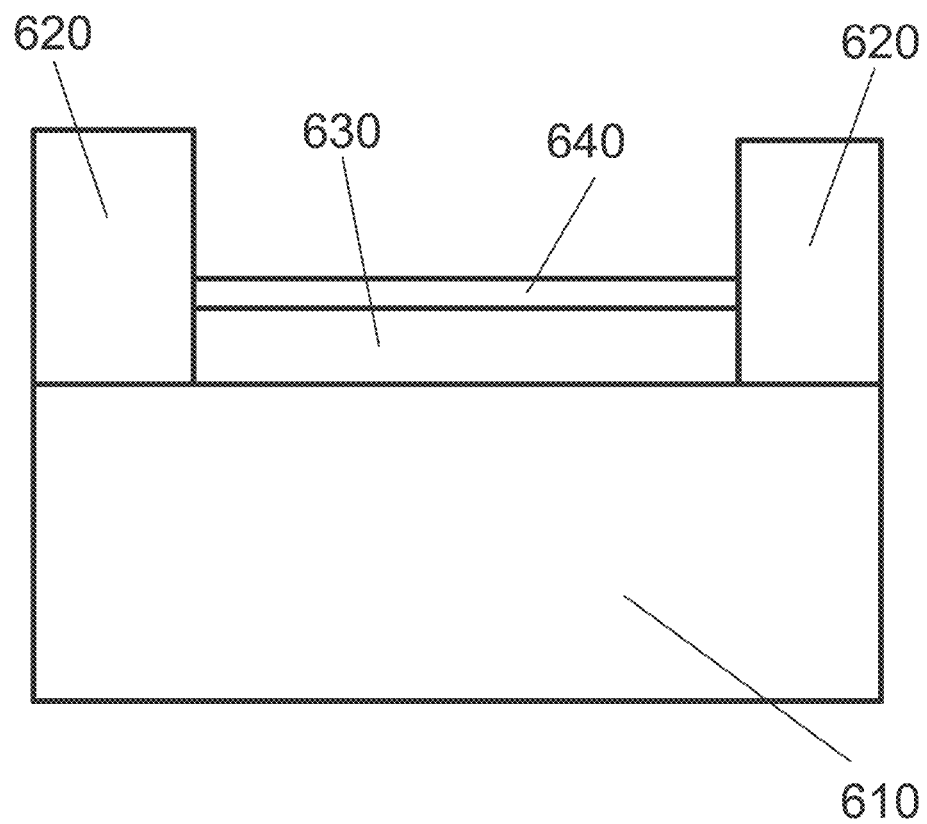
FIG. 6 illustrates a structure that can be formed using a method as described herein.

FIG. 6 shows an embodiment of a structure (600) that can be formed using a method as described herein. The structure (600) comprises a monocrystalline substrate (610). The substrate (610) can comprise, for example, at least one of monocrystalline silicon and monocrystalline silicon-germanium. The structure (600) further comprises a patterned dielectric layer (620). The dielectric layer (620) can comprise, for example, at least one of silicon oxide and silicon nitride. The structure further comprises a lowly doped layer (630) and a highly doped layer (640). Both the lowly doped layer (630) and the highly doped layer (640) substantially consist of boron-doped silicon germanium, and can be grown using a method as described herein. The lowly doped layer can have a thickness, for example, of around 50 nm and a resistivity of around 0.2 mOhm·cm. The highly doped layer (640) can have a thickness, for example, or around 5 nm and 0.13 mOhm·cm. The structure (600) shows lowly and highly doped silicon-germanium layer (630,640) growth only on the monocrystalline substrate (610) and not on the dielectric layer (620). Such area-selective growth can be obtained using various means such as etchant co-flow, deposition-etch cyclical processes, and relying on nucleation delay on the dielectric surface (620) versus the monocrystalline substrate (610).

It can be difficult to grow a highly doped layer having both a substantially high thickness, of e.g. higher than 10 nm, and few defects. It can be comparatively easy to grow a lower doped layer having both a substantially high thickness, of e.g. higher than 10 nm, and few defects. A structure as shown in FIG. 6 can advantageously offer good crystallographic quality and a high surface concentration, and thus low contact resistance, such as contact resistivity below 1e−9 Ohm·cm$^2$.

In an exemplary embodiment, the lowly doped layer can be formed using the following process parameters: substrate temperature of at most 400° C.; $B_2H_6$ is used as a first boron precursor and is provided to the reaction chamber at a flow rate of at least 1 sccm to at most 100 sccm, such as of at least 15 sccm to at most 25 sccm; the first silicon precursor comprises dichlorosilane and monosilane; the first germanium precursor comprises monogermane; one or more of the silicon precursor, the germanium precursor, and the first boron precursor is provided to the reaction chamber using a carrier gas, such as a carrier gas comprising at least one of $N_2$ and $H_2$; the reaction chamber is maintained at a pressure of at least 10 Torr to at most 80 Torr, such as at a pressure of at least 10 Torr to at most 20 Torr; the deposition process comprises alternating deposition steps and etch steps, wherein $Cl_2$ in $N_2$ is employed as an etch gas.

In an exemplary embodiment, the highly doped layer can be formed using the following process parameters: substrate temperature of at most 400° C.; $B_2H_6$ is used as a second boron precursor and is provided to the reaction chamber at a flow rate of at least 1 sccm to at most 100 sccm, such as of at least 15 sccm to at most 25 sccm; the second silicon precursor substantially consists of dichlorosilane; the second germanium precursor comprises monogermane; one or more of the second silicon precursor, the second germanium precursor, and the second boron precursor is provided to the reaction chamber using a carrier gas, such as a carrier gas comprising at least one of $N_2$ and $H_2$; the reaction chamber is maintained at a pressure of at least 10 Torr to at most 80 Torr, such as at a pressure of at least 10 Torr to at most 20 Torr; suitably forming the highly doped layer can consist of a deposition step only, and no etch step.

In some embodiments, at least one of the temperature and pressure during formation of the lowly doped layer equals the temperature and pressure during formation of the highly doped layer.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A method for epitaxially growing a boron doped silicon germanium layer comprising:

providing a substrate comprising a monocrystalline surface in a reaction chamber;
performing a plurality of deposition-etch cycles, a deposition-etch cycle comprising the steps of:
exposing the substrate to a gas mixture comprising a silicon precursor, a germanium precursor, and a boron precursor into the reaction chamber, thereby epitaxially growing a boron doped silicon germanium layer on the monocrystalline surface,
purging the reaction chamber, and
after purging the reaction chamber, introducing an etch gas into the reaction chamber; and
while exposing the substrate to the silicon precursor, the germanium precursor, and the boron precursor, maintaining the substrate at a temperature of at most 450° C.,
wherein the silicon precursor comprises a halosilane.

2. The method according to claim 1 wherein the substrate is maintained at a temperature of at least 300° C. to at most 450° C.

3. The method according to claim 1, wherein the silicon precursor comprises a chlorosilane.

4. The method according to claim 3, wherein the chlorosilane comprises dichlorosilane, wherein the boron precursor comprises a borane, and wherein the boron doped silicon germanium layer has a resistivity less than 0.2 mOhm·cm.

5. The method according to claim 1 wherein the reaction chamber is maintained at a pressure of at least 5 Torr to at most 160 Torr.

6. The method according to claim 1 wherein the substrate comprises a first surface and a second surface, wherein the first surface is a monocrystalline surface, wherein the second surface is a dielectric surface, and wherein the boron doped silicon germanium layer is selectively and epitaxially grown on the first surface.

7. The method according to claim 6, wherein parasitic boron doped silicon germanium is grown on the second surface and wherein the step of introducing an etch gas thereby etches the parasitic boron doped silicon germanium grown on the second surface.

8. The method according to claim 1, wherein the gas mixture consists essentially of a carrier gas, the silicon precursor, the germanium precursor, and the boron precursor.

9. The method according to claim 1, wherein the etch gas comprises a halogen.

10. The method according to claim 6 wherein the second surface is selected from the list consisting of a silicon oxide surface, a silicon nitride surface, a silicon oxycarbide surface, a silicon oxynitride surface, a hafnium oxide surface, a zirconium oxide surface, and an aluminum oxide surface.

11. The method according to claim 1, wherein the boron doped silicon germanium layer has a resistivity less than 0.18 mOhm·cm.

12. The method according to claim 6, wherein the first surface has hydrogen termination 1.

13. The method according to claim 1 wherein the silicon precursor comprises the halosilane and a silane.

14. The method according to claim 1 wherein the boron doped silicon germanium layer has a resistivity less than 0.2 mOhm·cm.

15. The method according to claim 1, wherein the monocrystalline surface comprises Si(110) or Si(001).

16. A method for epitaxially growing a boron doped silicon germanium bilayer, the bilayer comprising a lowly doped layer and a highly doped layer, the method comprising:
providing a substrate comprising a monocrystalline surface in a reaction chamber;
epitaxially forming the lowly doped layer on the substrate; and
epitaxially forming the highly doped layer on the lowly doped layer,
wherein epitaxially forming the lowly doped layer comprises performing a plurality of deposition-etch cycles, a deposition-etch cycle comprising the steps of:
exposing the substrate to a first silicon precursor, a first germanium precursor, and a first boron precursor,
purging the reaction chamber, and
after purging the reaction chamber, introducing an etch gas into the reaction chamber;
wherein epitaxially forming the highly doped layer comprises exposing the substrate to a second silicon precursor, a second germanium precursor, and a second boron precursor;
wherein the substrate is maintained at a temperature of at most 450° C. while forming the lowly doped layer and while forming the highly doped layer; and
wherein at least one of the first silicon precursor and the second precursor comprises a halosilane.

17. The method according to claim 16 wherein the lowly doped layer is formed using a method according to claim 1.

18. The method according to claim 16 wherein the highly doped layer is formed using a method according to claim 1.

* * * * *